(12) United States Patent
Lin et al.

(10) Patent No.: US 12,193,188 B2
(45) Date of Patent: Jan. 7, 2025

(54) IMMERSION COOLING SYSTEM

(71) Applicant: DELTA ELECTRONICS, INC., Taoyuan (TW)

(72) Inventors: Chia-Yi Lin, Taoyuan (TW); Wei-Chih Lin, Taoyuan (TW); Ren-Chun Chang, Taoyuan (TW); Yan-Hui Jian, Taoyuan (TW); Hsuan-Ting Liu, Taoyuan (TW); Li-Hsiu Chen, Taoyuan (TW); Wen-Yin Tsai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 368 days.

(21) Appl. No.: 17/663,827

(22) Filed: May 17, 2022

(65) Prior Publication Data
US 2023/0026658 A1     Jan. 26, 2023

Related U.S. Application Data

(60) Provisional application No. 63/223,984, filed on Jul. 21, 2021.

(30) Foreign Application Priority Data

Feb. 8, 2022   (CN) .......................... 202210117207.1

(51) Int. Cl.
    *H05K 7/20*     (2006.01)
(52) U.S. Cl.
    CPC ......... *H05K 7/203* (2013.01); *H05K 7/20318* (2013.01); *H05K 7/20327* (2013.01)

(58) Field of Classification Search
    CPC .......................... H05K 7/203; H05K 7/20318
    See application file for complete search history.

(56) References Cited

U.S. PATENT DOCUMENTS

| 8,713,957 | B2 | 5/2014 | Campbell et al. |
| 9,844,166 | B2 | 12/2017 | Shelnutt et al. |
| 10,045,467 | B2* | 8/2018 | Smith ................ H05K 7/20318 |
| 10,143,113 | B2 | 11/2018 | Shelnutt et al. |
| 10,206,307 | B2* | 2/2019 | Lau .......... H05K 7/203 |
| 10,765,033 | B1* | 9/2020 | Keehn ................ H05K 7/20318 |
| 10,773,192 | B1 | 9/2020 | Lau |
| 11,076,508 | B2* | 7/2021 | Gao ................... H05K 7/20836 |

(Continued)

FOREIGN PATENT DOCUMENTS

| CN | 200974767 Y | 11/2007 |
| CN | 105607715 A | 5/2016 |

(Continued)

*Primary Examiner* — Christopher R Zerphey
(74) *Attorney, Agent, or Firm* — CKC & Partners Co., LLC (57) ABSTRACT

An immersion cooling system includes a tank, a first condenser, an enclosure, a second condenser and a connecting pipe. The tank has a first space. The first space is configured to accommodate a cooling liquid for at least one electronic equipment to immerse therein. The first condenser is disposed inside the tank. The enclosure is disposed outside the tank. The enclosure forms a second space together with the tank. The second condenser is disposed in the second space. The connecting pipe includes a first end and a second end opposite to the first end. The first end is connected with the second condenser. The second end is communicated with the first space.

10 Claims, 6 Drawing Sheets

(56) References Cited

U.S. PATENT DOCUMENTS

| | | | |
|---|---|---|---|
| 11,612,081 B2* | 3/2023 | Gao | H05K 7/20327 |
| 11,744,041 B2* | 8/2023 | Smith | H05K 7/20327 361/699 |
| 11,818,870 B2* | 11/2023 | Gao | H05K 7/20318 |
| 11,849,534 B2* | 12/2023 | Gao | H05K 7/203 |
| 11,963,332 B2* | 4/2024 | Gao | H05K 7/203 |
| 12,004,325 B2* | 6/2024 | Chen | H05K 7/20818 |
| 2016/0345461 A1* | 11/2016 | Smith | H05K 7/203 |
| 2017/0112017 A1* | 4/2017 | Wang | H05K 7/20236 |
| 2019/0159360 A1 | 5/2019 | Uchida | |
| 2020/0236808 A1 | 7/2020 | Smith | |
| 2020/0305310 A1 | 9/2020 | Alissa et al. | |
| 2021/0059079 A1 | 2/2021 | Keehn et al. | |
| 2023/0156961 A1* | 5/2023 | Yuan | H05K 7/203 361/700 |
| 2023/0309271 A1* | 9/2023 | Gao | H05K 7/20827 |

FOREIGN PATENT DOCUMENTS

| | | |
|---|---|---|
| CN | 108966603 A | 12/2018 |
| CN | 109618538 A | 4/2019 |
| GB | 2389174 A | 12/2003 |
| GB | 2549946 A | 11/2017 |
| TW | I633407 B | 8/2018 |
| TW | I640239 B | 11/2018 |
| TW | 201925718 A | 7/2019 |
| TW | 202020385 A | 6/2020 |
| TW | M610160 U | 4/2021 |

* cited by examiner

IMMERSION COOLING SYSTEM

RELATED APPLICATIONS

This application claims priority to U.S. Provisional Application Ser. No. 63/223,984 filed Jul. 21, 2021 and Chinese Application Serial Number 202210117207.1 filed Feb. 8, 2022, which are herein incorporated by reference.

BACKGROUND

Technical Field

The present disclosure relates to immersion cooling systems.

Description of Related Art

During the operation of large electronic equipment, in order to effectively avoid the reduction of operational performance and even damage due to its generation of excessive heat, the way to carry out effective heat dissipation to the large electronic equipment under a reliable condition is undoubtedly an important issue to the industry.

In the application of immersion cooling system, a user will immerse the large electronic equipment into the cooling liquid inside the immersion cooling system, in order to deliver away the heat generated by the electronic equipment during operation.

SUMMARY

A technical aspect of the present disclosure is to provide an immersion cooling system, which can effectively avoid the chance of outflow of the cooling liquid from the tank due to the poor sealing condition of the tank, and thus effectively control the cost of operation of the immersion cooling system.

According to an embodiment of the present disclosure, an immersion cooling system includes a tank, a first condenser, an enclosure, a second condenser and a connecting pipe. The tank has a first space. The first space is configured to accommodate a cooling liquid for at least one electronic equipment to immerse therein. The first condenser is disposed inside the tank. The enclosure is disposed outside the tank. The enclosure forms a second space together with the tank. The second condenser is disposed in the second space. The connecting pipe includes a first end and a second end opposite to the first end. The first end is connected with the second condenser. The second end is communicated with the first space.

In one or more embodiments of the present disclosure, the second condenser and the first condenser are separated from each other.

In one or more embodiments of the present disclosure, the immersion cooling system further includes a first sealing element. The first sealing element is sealed between the enclosure and the tank.

In one or more embodiments of the present disclosure, the immersion cooling system further includes a check valve. The check valve is disposed on the connecting pipe.

In one or more embodiments of the present disclosure, the tank has an opening. The opening is communicated between the first space and the second space. The immersion cooling system further includes a cover. The cover is pivotally connected with the tank and is configured to open or close the opening.

In one or more embodiments of the present disclosure, the immersion cooling system further includes a second sealing element. The second sealing element is sealed between the cover and the tank.

In one or more embodiments of the present disclosure, the second condenser further includes a main body, a fan, an input port and an output port. The main body is connected with the connecting pipe. The main body is configured to condense a gas into a liquid. The main body has at least one first through hole. The fan is connected with the main body. The fan is configured to absorb the gas into the main body through the first through hole. The input port is communicated with the main body. The input port is configured to allow a water to flow into the main body. The output port is communicated with the main body. The output port is configured to allow the water to flow away from the main body.

In one or more embodiments of the present disclosure, the second condenser further includes at least one extension pipe. The extension pipe is connected with the main body. The extension pipe is communicated with the first through hole. The extension pipe has a plurality of second through holes. The second through holes are arranged along an extending direction of the extension pipe.

In one or more embodiments of the present disclosure, a quantity of the first through hole and a quantity of the extension pipe are respectively plural.

In one or more embodiments of the present disclosure, the first condenser includes a main body, an input port and an output port. The input port and the output port are respectively communicated with the main body. The input port is configured to allow a water to flow into the main body. The output port is configured to allow the water to flow away from the main body. The main body is configured to condense a gas into a liquid.

In one or more embodiments of the present disclosure, the second condenser is independently operational from the first condenser.

In one or more embodiments of the present disclosure, the first condenser is a water-cooling condenser. The second condenser is an air-cooling condenser separated from the water-cooling condenser.

The above-mentioned embodiments of the present disclosure have at least the following advantages:

(1) Even if the tank is in a poor sealing condition, the vapor leaked from the tank can be collected within the second space formed by the enclosure and the tank together. Afterwards, the vapor leaked from the tank and collected within the second space can be condensed by the second condenser in the second space to revert to the cooling liquid of the liquid form, which then flows back to the cooling liquid in the first space through the connecting pipe. In this way, the immersion cooling system is able to effectively avoid the chance of outflow of the cooling liquid from the tank due to the poor sealing condition of the tank. Thus, the cost of operation of the immersion cooling system can be effectively controlled.

(2) Since the second condenser and the first condenser are independently operational from each other, the immersion cooling system has a good flexibility of operation.

(3) When the cover is opened relative to the opening during the maintenance of the immersion cooling system, since the enclosure is disposed outside the tank and forms the second space together with the tank, the vapor left from the first space through the opening of the tank will be collected in the second space. In this way, the immersion cooling system is able to effectively avoid the outflow of the cooling liquid, and thus the cost of operation of the immersion cooling system can be effectively controlled.

BRIEF DESCRIPTION OF THE DRAWINGS

The disclosure can be more fully understood by reading the following detailed description of the embodiments, with reference made to the accompanying drawings as follows.

DETAILED DESCRIPTION

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
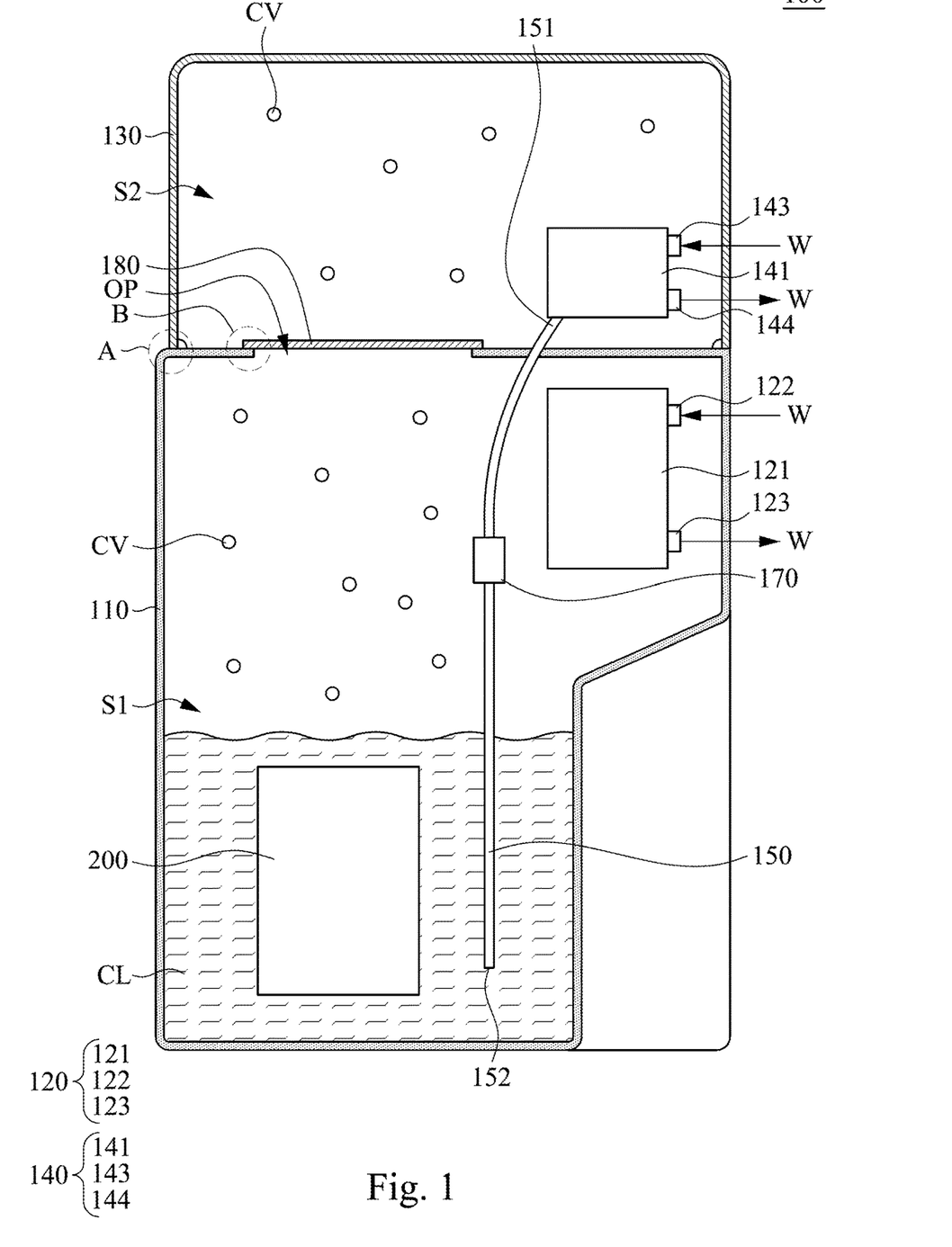
FIG. 1 is a sectional view of an immersion cooling system according to an embodiment of the present disclosure.

Reference is made to FIG. 1. FIG. 1 is a sectional view of an immersion cooling system 100 according to an embodiment of the present disclosure. In this embodiment, as shown in FIG. 1, an immersion cooling system 100 includes a tank 110, a first condenser 120, an enclosure 130, a second condenser 140 and a connecting pipe 150. The tank 110 has a first space S1. The first space S1 is configured to accommodate a cooling liquid CL for at least one electronic equipment 200 to immerse therein. During the operation of the electronic equipment 200, the electronic equipment 200 generates heat. The hot electronic equipment 200 evaporates a portion of the cooling liquid CL to form a vapor CV. The vapor CV being heated up floats upwards and leaves from the cooling liquid CL. The first condenser 120 is disposed inside the tank 110. The first condenser 120 is configured to condense the vapor CV in the first space S1, such that the vapor CV reverts to the cooling liquid CL in the liquid form. In this way, through repeated conversions between the gas form and the liquid form of the cooling liquid CL, a fluid circulation is formed in the first space S1 of the tank 110.

Furthermore, the enclosure 130 is disposed outside the tank 110. The enclosure 130 forms a second space S2 together with an outer surface of the tank 110. As mentioned above, during the operation of the electronic equipment 200, a portion of the cooling liquid CL is heated up to form the vapor CV in the first space S1. At this point, in case the tank 110 is badly sealed, the vapor CV in the first space S1 may leak and leave from the tank 110. However, since the enclosure 130 is disposed outside the tank 110 and forms a second space S2 together with the outer surface of the tank 110, the vapor CV leaked from the first space S1 of the tank 110 will be collected within the second space S2. The second condenser 140 is disposed in the second space S2. The second condenser 140 is configured to condense the vapor CV leaked to the second space S2, such that the vapor CV reverts to the cooling liquid CL in the liquid form. The connecting pipe 150 includes a first end 151 and a second end 152 opposite to the first end 151. The first end 151 of the connecting pipe 150 is connected with the second condenser 140. The second end 152 of the connecting pipe 150 is communicated with the first space S1. Therefore, the cooling liquid CL reverted to the liquid form by the second condenser 140 can first enter into the first end 151 of the connecting pipe 150 and then flow back to the cooling liquid CL in the first space S1 from the second end 152 of the connecting pipe 150 after flowing through the connecting pipe 150.

In other words, even if the tank 110 is in a poor sealing condition, the vapor CV leaked from the tank 110 can be collected within the second space S2 formed by the enclosure 130 and the outer surface of the tank 110 together. Afterwards, the vapor CV leaked from the tank 110 and collected within the second space S2 can be condensed by the second condenser 140 in the second space S2 to revert to the cooling liquid CL in the liquid form, which then flows back to the cooling liquid CL in the first space S1 through the connecting pipe 150. In this way, the immersion cooling system 100 is able to effectively avoid the chance of outflow of the cooling liquid CL from the tank 110 due to the poor sealing condition of the tank 110. Thus, the cost of operation of the immersion cooling system 100 can be effectively controlled.

In this embodiment, the second condenser 140 and the first condenser 120 are separated from each other. This means the second condenser 140 and the first condenser 120 are independently operational from each other. In other words, for example, during the operation of the first condenser 120, the second condenser 140 can be stopped from operating according to the actual situation. Therefore, the immersion cooling system 100 has a good flexibility of operation.

In practical applications, for example, the first condenser 120 can be a water-cooling condenser. To be specific, as shown in FIG. 1, the first condenser 120 includes a main body 121, an input port 122 and an output port 123. The input port 122 and the output port 123 are respectively communicated with the main body 121. The input port 122 is configured to allow a water W to flow into the main body 121. The output port 123 is configured to allow the water W to flow away from the main body 121. Through the flow of the water W within the main body 121, the main body 121 is configured to condense a gas into a liquid. To be precise, the main body 121 condenses the vapor CV in the first space S1 into the cooling liquid CL.

In addition, as shown in FIG. 1, the immersion cooling system 100 further includes a check valve 170. The check valve 170 is disposed on the connecting pipe 150. The check valve 170 is configured to restrict the flowing direction of the cooling liquid CL inside the connecting pipe 150. To be specific, the check valve 170 allows the cooling liquid CL to flow from the second condenser 140 to the first space S1, but restricts the cooling liquid CL or the vapor CV evaporated from the cooling liquid CL from flowing to the second condenser 140 from the first space S1 via the connecting pipe 150.

Figure 2:
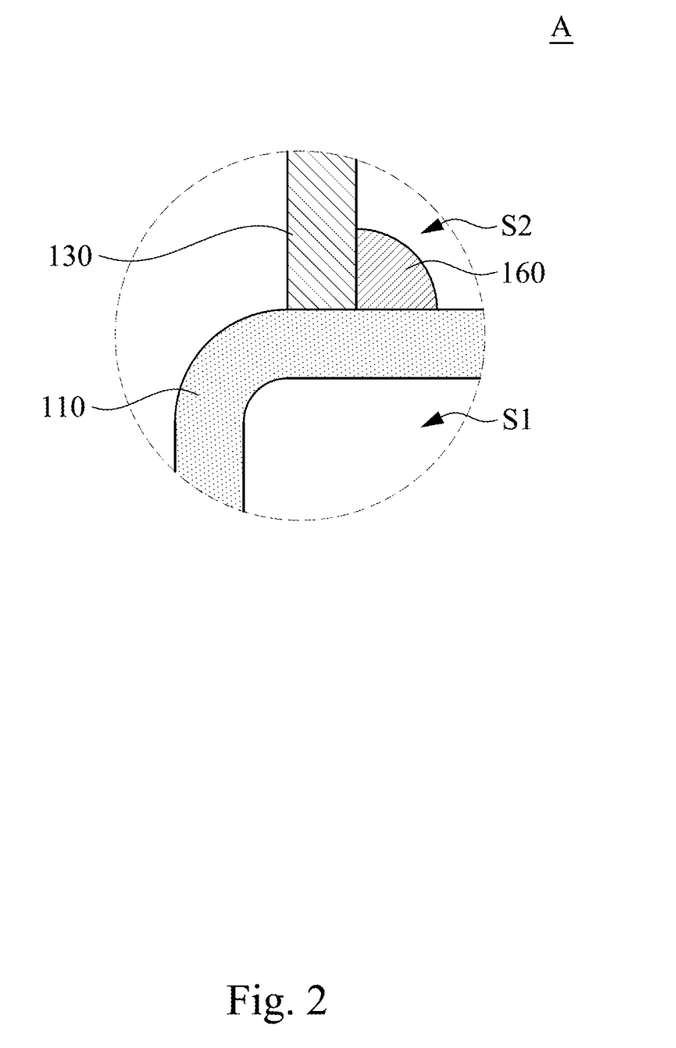
FIG. 2 is a partially enlarged view of the area A of FIG. 1.

Reference is made to FIG. 2. FIG. 2 is a partially enlarged view of the area A of FIG. 1. In practical applications, as shown in FIG. 2, the immersion cooling system 100 further includes a first sealing element 160. The first sealing element 160 is sealed between the enclosure 130 and the tank 110, in order to increase the degree of sealing between the enclosure 130 and the tank 110. Thus, the chance of leakage of the vapor CV from the second space S2 formed together by the enclosure 130 and the tank 110 is reduced.

Figure 3:
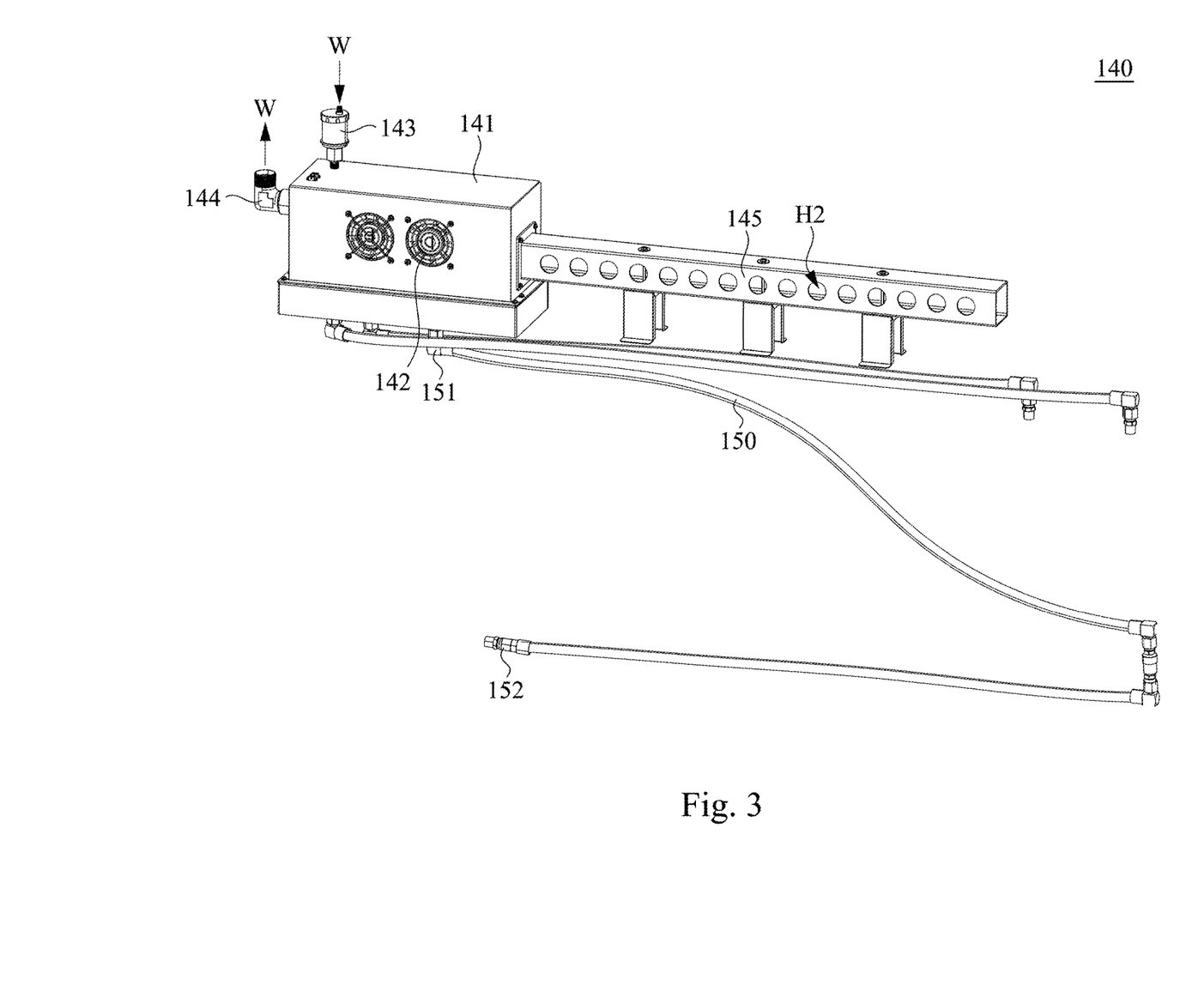
FIG. 3 is a schematic enlarged view of the second condenser of FIG. 1.
Figure 4:
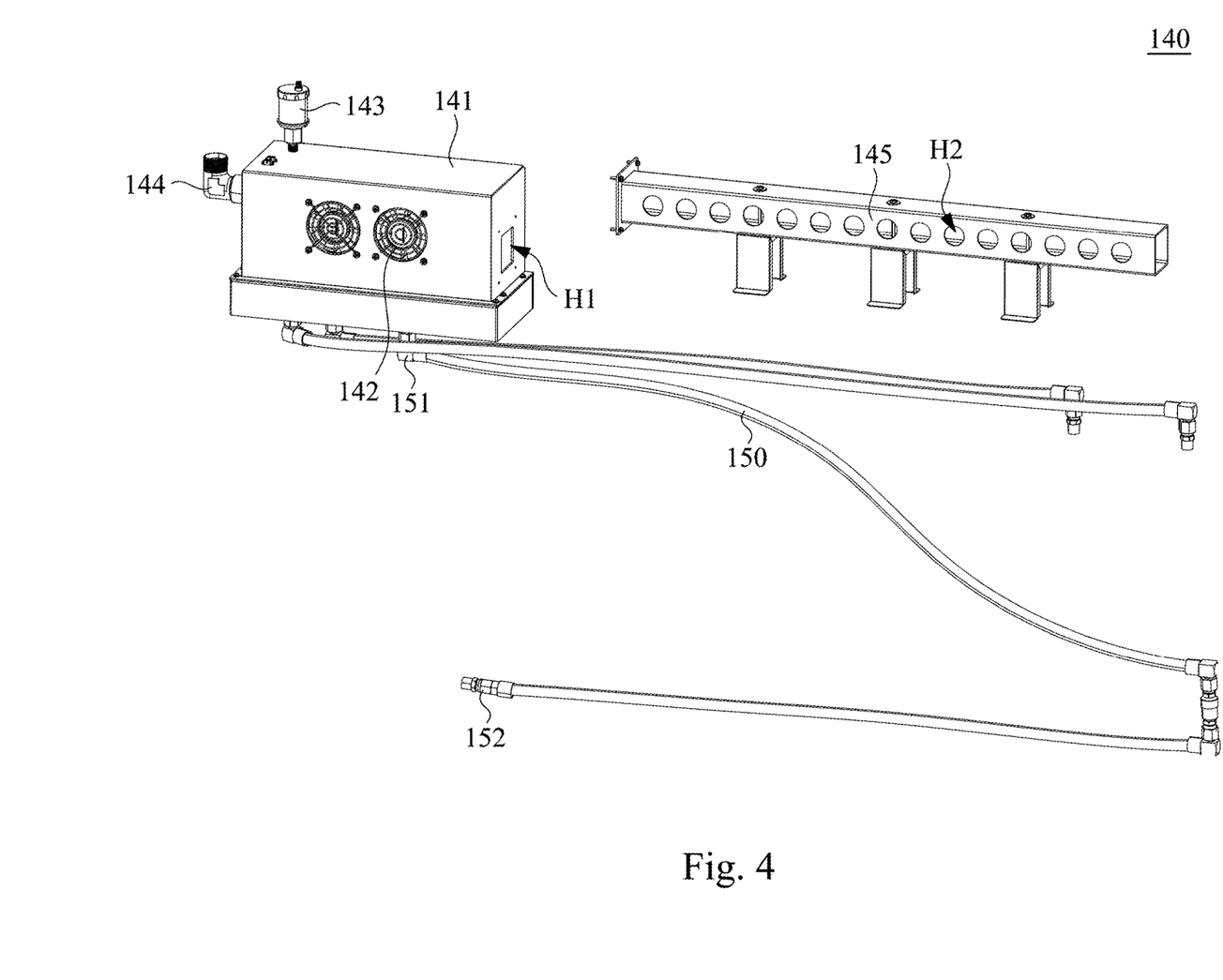
FIG. 4 is a partially exploded view of the second condenser of FIG. 3.

Reference is made to FIGS. 3-4. FIG. 3 is a schematic enlarged view of the second condenser 140 of FIG. 1. FIG. 4 is a partially exploded view of the second condenser 140 of FIG. 3. In practical applications, for example, the second condenser 140 can be a water-cooling condenser. As shown in FIGS. 3-4, the second condenser 140 further includes a main body 141, a fan 142, an input port 143 and an output port 144. The main body 141 is connected with the first end 151 of the connecting pipe 150. The main body 141 has at least one first through hole H1 (please see FIG. 4). The main body 141 is configured to condense a gas into a liquid. That means the main body 141 condenses the vapor CV in the second space S2 into the cooling liquid CL, and the cooling liquid CL then flows back to the first space S1 through the connecting pipe 150. The fan 142 is connected with the main body 141. The fan 142 is configured to absorb the gas into the main body 141 through the first through hole H1. That means the fan 142 absorbs the vapor CV in the second space S2 into the main body 141 through the first through hole H1. The input port 143 is communicated with the main body 141. The input port 143 is configured to allow a water W to flow into the main body 141. The output port 144 is communicated with the main body 141. The output port 144 is configured to allow the water W to flow away from the main body 141. Through the flow of the water W within the main body 141, the main body 141 condenses the vapor CV in the second space S2 into the cooling liquid CL.

Moreover, the second condenser 140 further includes at least one extension pipe 145. The extension pipe 145 is connected with the main body 141. The extension pipe 145 is communicated with the first through hole H1. The extension pipe 145 has a plurality of second through holes H2. The second through holes H2 are arranged along an extending direction of the extension pipe 145. When the fan 142 operates, the vapor CV in the second space S2 is absorbed into the extension pipe 145 through the second through holes H2. Subsequently, the vapor CV in the extension pipe 145 is absorbed into the main body 141 through the first through hole H1 and is then condensed into the cooling liquid CL by the main body 141. Through the extension pipe 145 and the second through holes H2 distributed thereon, the vapor CV in the second space S2 can be absorbed into the main body 141 in an easier manner. According to the actual situation, a quantity of the first through hole H1 and a quantity of the extension pipe 145 can respectively be plural. However, this does not intend to limit the present disclosure.

Furthermore, the fan 142 is at least partially exposed outside the main body 141. After the vapor CV in the second space S2 is absorbed into the main body 141 by the fan 142, the gas accompanied with the vapor CV absorbed or the vapor CV not yet condensed by the main body 141 will be discharged out of the main body 141 through the fan 142.

In other embodiments, the second condenser 140 can be a non-water-cooling condenser. For example, the second condenser 140 can be an air-cooling condenser or a thermoelectric cooler condenser. Under these conditions, the second condenser 140 does not include the input port 143 and the output port 144 mentioned above.

Figure 5:
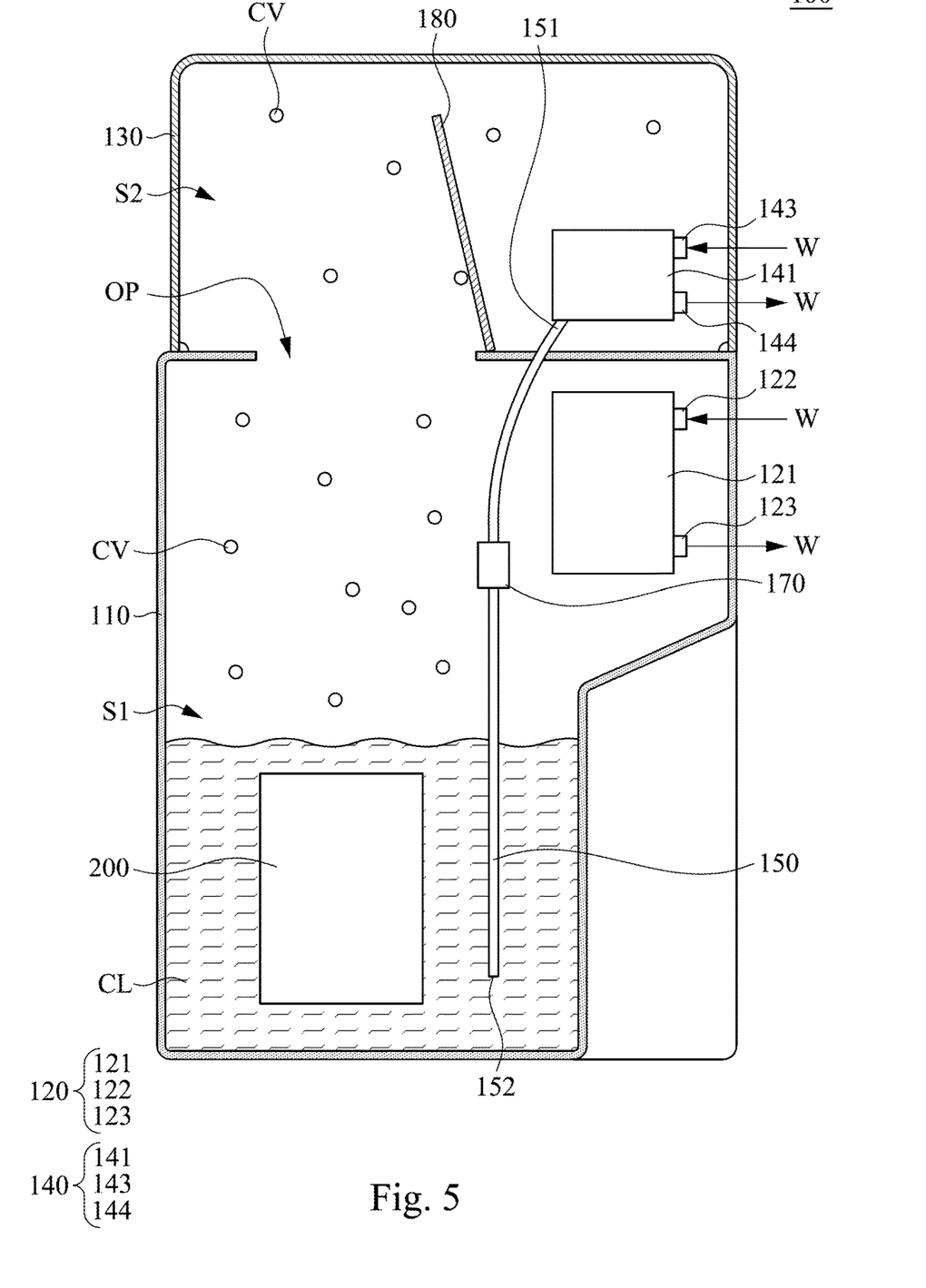
FIG. 5 is a sectional view of an immersion cooling system of FIG. 1, in which the cover is in an opening status.

Reference is made to FIG. 5. FIG. 5 is a sectional view of an immersion cooling system 100 of FIG. 1, in which the cover 180 is in an opening status. In this embodiment, as shown in FIG. 5, the tank 110 has an opening OP. The opening OP is communicated between the first space S1 and the second space S2. The immersion cooling system 100 further includes a cover 180. The cover 180 is pivotally connected with the tank 110, and is configured to rotate relative to the tank 110 in order to open or close the opening OP. As shown in FIG. 1, when the cover 180 closes the opening OP, the cover 180 isolates the first space S1 from the second space S2. This means the first space S1 and the second space S2 are not communicated with each other. On the other hands, for example, as shown in FIG. 5, when the cover 180 is opened relative to the opening OP during the maintenance of the immersion cooling system 100, the first space S1 and the second space S2 are communicated with each other. As mentioned above, since the enclosure 130 is disposed outside the tank 110 and forms the second space S2 together with the outer surface of the tank 110, the vapor CV left from the first space S1 through the opening OP of the tank 110 will be collected in the second space S2. In this way, the immersion cooling system 100 is able to effectively avoid the outflow of the cooling liquid CL, and thus the cost of operation of the immersion cooling system 100 can be effectively controlled.

Figure 6:
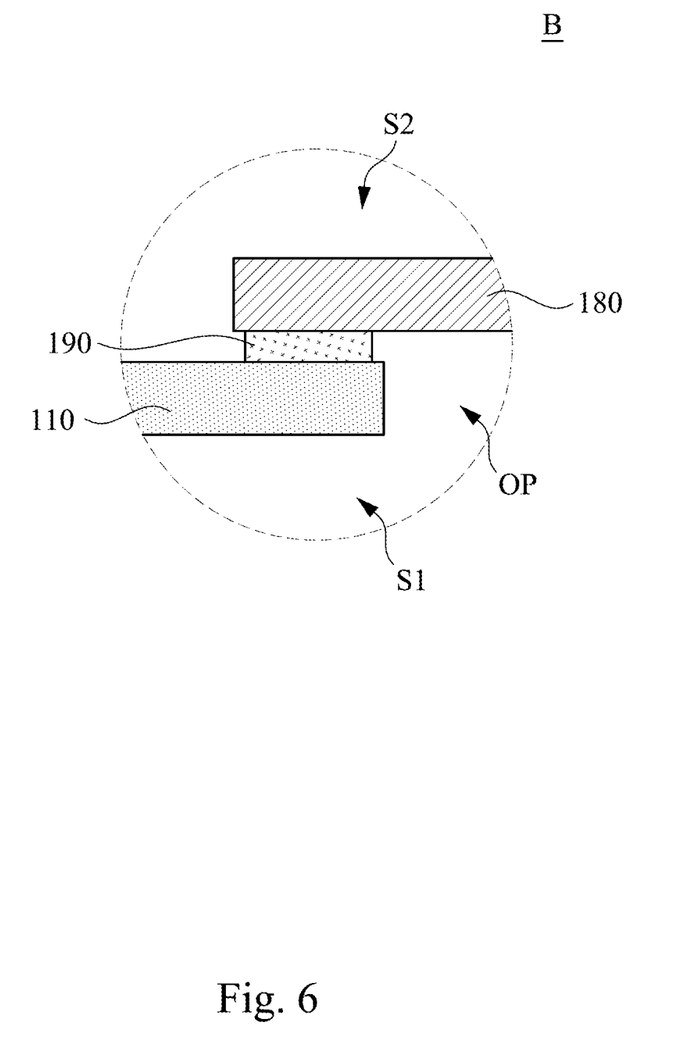
FIG. 6 is a partially enlarged view of the area B of FIG. 1.

Reference is made to FIG. 6. FIG. 6 is a partially enlarged view of the area B of FIG. 1. In practical applications, as shown in FIG. 6, the immersion cooling system 100 further includes a second sealing element 190. The second sealing element 190 is sealed between the cover 180 and the tank 110. When the cover 180 closes the opening OP, the second sealing element 190 can increase the degree of sealing between the cover 180 and the tank 110. Thus, the chance of leakage of the vapor CV from the first space S1 is reduced.

In conclusion, the aforementioned embodiments of the present disclosure have at least the following advantages:

(1) Even if the tank is in a poor sealing condition, the vapor leaked from the tank can be collected within the second space formed by the enclosure and the tank together. Afterwards, the vapor leaked from the tank and collected within the second space can be condensed by the second condenser in the second space to revert to the cooling liquid of the liquid form, which then flows back to the cooling liquid in the first space through the connecting pipe. In this way, the immersion cooling system is able to effectively avoid the chance of outflow of the cooling liquid from the tank due to the poor sealing condition of the tank. Thus, the cost of operation of the immersion cooling system can be effectively controlled.

(2) Since the second condenser and the first condenser are independently operational from each other, the immersion cooling system has a good flexibility of operation.

(3) When the cover is opened relative to the opening during the maintenance of the immersion cooling system, since the enclosure is disposed outside the tank and forms the second space together with the tank, the vapor left from the first space through the opening of the tank will be collected in the second space. In this way, the immersion cooling system is able to effectively avoid the outflow of the cooling liquid, and thus the cost of operation of the immersion cooling system can be effectively controlled.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An immersion cooling system, comprising:
   a tank having a first space configured to accommodate a cooling liquid for at least one electronic equipment to immerse therein;
   a first condenser disposed inside the tank;
   an enclosure disposed outside the tank and forming a second space together with the tank;
   a second condenser disposed in the second space, the second condenser comprising:
      a first main body configured to condense a first gas into a first liquid, the first main body having at least one first through hole;
      a fan connected with the first main body and configured to absorb the first gas into the first main body through the first through hole;
      a first input port communicated with the first main body and configured to allow a first water to flow into the first main body;
      a first output port communicated with the first main body and configured to allow the first water to flow away from the first main body; and
      at least one extension pipe connected with the first main body and communicated with the first through hole, the extension pipe having a plurality of second through holes arranged along an extending direction of the extension pipe; and
   a connecting pipe comprising a first end and a second end opposite to the first end, the first end connecting with the first main body, the second end being communicated with the first space.

2. The immersion cooling system of claim 1, wherein the second condenser and the first condenser are separated from each other.

3. The immersion cooling system of claim 1, further comprising:
   a first seal sealed between the enclosure and the tank.

4. The immersion cooling system of claim 1, further comprising:
   a check valve disposed on the connecting pipe.

5. The immersion cooling system of claim 1, wherein the tank has an opening communicated between the first space and the second space, the immersion cooling system further comprises:
   a cover pivotally connected with the tank and configured to open or close the opening.

6. The immersion cooling system of claim 5, further comprising:
   a second seal sealed between the cover and the tank.

7. The immersion cooling system of claim 1, wherein a quantity of the first through hole and a quantity of the extension pipe are respectively plural.

8. The immersion cooling system of claim 1, wherein the first condenser comprises a second main body, a second input port and a second output port, the second input port and the second output port are respectively communicated with the second main body, the second input port is configured to allow a second water to flow into the second main body, the second output port is configured to allow the second water to flow away from the second main body, and the second main body is configured to condense a second gas into a second liquid.

9. The immersion cooling system of claim 1, wherein the second condenser is independently operational from the first condenser.

10. The immersion cooling system of claim 1, wherein the first condenser is a water-cooling condenser, the second condenser is an air-cooling condenser separated from the water-cooling condenser.

* * * * *